United States Patent
Micheloni et al.

(10) Patent No.: US 8,656,257 B1
(45) Date of Patent: Feb. 18, 2014

(54) NONVOLATILE MEMORY CONTROLLER WITH CONCATENATED ERROR CORRECTION CODES

(75) Inventors: Rino Micheloni, Turate (IT); Alessia Marelli, Dalmine (IT); Peter Z. Onufryk, Flanders, NJ (US); Christopher I. W. Norrie, San Jose, CA (US)

(73) Assignee: PMC-Sierra US, Inc., Sunnyvale, CA (US)

( * ) Notice: Subject to any disclaimer, the term of this patent is extended or adjusted under 35 U.S.C. 154(b) by 103 days.

(21) Appl. No.: 13/434,770

(22) Filed: Mar. 29, 2012

Related U.S. Application Data (60) Provisional application No. 61/585,627, filed on Jan. 11, 2012.

(51) Int. Cl.
*G11C 29/00* (2006.01)
*H03M 13/00* (2006.01)

(52) U.S. Cl.
USPC ............... 714/773; 714/758; 714/764

(58) Field of Classification Search
None
See application file for complete search history.

(56) References Cited

U.S. PATENT DOCUMENTS

| | | | |
|---|---|---|---|
| 6,115,788 A * | 9/2000 | Thowe | 711/114 |
| 6,934,804 B2 * | 8/2005 | Hashemi | 711/114 |
| 6,976,194 B2 * | 12/2005 | Cypher | 714/711 |
| 8,255,770 B2 | 8/2012 | Park et al. | |
| 8,335,977 B2 | 12/2012 | Weingarten et al. | |
| 2003/0225970 A1 * | 12/2003 | Hashemi | 711/114 |
| 2004/0088636 A1 * | 5/2004 | Cypher | 714/764 |
| 2010/0199149 A1 | 8/2010 | Weingarten et al. | |
| 2011/0246853 A1 | 10/2011 | Kim et al. | |

* cited by examiner

*Primary Examiner* — Daniel McMahon
(74) *Attorney, Agent, or Firm* — Kenneth Glass; Molly Sauter; Glass & Associates (57) ABSTRACT

A nonvolatile memory controller may recover encoded data using the outer error correction code of the encoded data if it is determined that a correction capacity of the outer error correction code is not exceeded. Alternatively, the nonvolatile memory controller may recover the encoded data using the inner error correction code of the encoded data followed by the outer error correction code of the encoded data if it is determined that the correction capacity of the outer error correction code is exceeded. Additionally, if it is determined that the correction capacity of the outer error correction code is exceed after recovering the data using the inner error correction code, the nonvolatile memory storage module may perform a redundant array of independent disks (RAID) operation to recover the data.

25 Claims, 4 Drawing Sheets

FIG. 4

NONVOLATILE MEMORY CONTROLLER WITH CONCATENATED ERROR CORRECTION CODES

CROSS-REFERENCES TO RELATED APPLICATIONS

The present application is related to U.S. Patent Application Ser. No. 61/585,627 filed on Jan. 11, 2012 and entitled "Error Correction Architecture for Reliable SSD that is incorporated herein by reference in its entirety.

BACKGROUND

A solid state drive (SSD) is a data storage device that utilizes solid-state memory to retain data in nonvolatile memory chips. NAND-based flash memories are widely used as the solid-state memory storage in SSDs due to their compactness, low power consumption, low cost, high data throughput and reliability. SSDs commonly employ several NAND-based flash memory chips and a flash controller to manage the flash memory and to transfer data between the flash memory and a host computer.

While NAND-based flash memories are reliable, they are not inherently error-free and often rely on error correction coding (ECC) to correct raw bit errors in the stored data. Various mechanisms may lead to bit errors in flash memories, including noise at the power rails, voltage threshold disturbances during the reading and/or writing of neighboring cells, retention loss due to leakage within in the cells and tunneling. Error correction codes (ECC) are commonly employed in flash memories to recover stored data that is affected by such error mechanisms. In operation, ECC supplements the user data with parity bits which store enough extra information for the data to be reconstructed if one or more of the data bits are corrupted. Generally, the number of data bit errors detectable and correctable in the data increases with an increasing number of error bits in the ECC. In many memory devices, data is stored in a memory location of the memory device along with the ECC for the data. In this way, the data and the ECC may be written to the memory location in a single write memory operation and read from the memory location in a single read memory operation. ECC is typically implemented in the flash memory controller.

NAND flash memories are based on floating gate storage. In floating gate storage technologies, two logic states are achieved by altering the number of electrons within the floating gate. The difference between the two logic states (1 and 0) is on the order of few electrons and is decreasing as the floating gate storage technology advances. The decreasing number of electrons responsible for the difference between the two logic states results in an increased probability of errors in the flash memory cell requiring more error correction. The fraction of data bits that are known to be corrupted, and therefore contain incorrect data, before applying the ECC is referred to as the raw bit error rate (RBER). As a result of the advances in the floating gate storage technology, the RBER for a flash page of memory cells is increasing and at technologies with feature sizes in the 1× range (below 20 nm) is nearing the Shannon Limit of the communication channel. The increased probability of errors in the stored data results in an increase in the error code correction necessary to correct the bit errors in the flash memory.

The error rate observed after application of the ECC is referred to as the uncorrectable bit error rate (UBER). The acceptable UBER is often dependent upon the application in which the SSD is employed. In the case of price sensitive, consumer applications, which experience a relatively low number of memory accesses during the SSD product lifetime, the SSD may tolerate a higher UBER as compared to a high-end application experiencing a relatively high number of memory accesses, such as an Enterprise application.

One type of error correction coding often employed in a flash storage controller is a Bose-Chaudhuri-Hochquenghem (BCH) error correction. Typically, a target UBER for an SSD ranges between $10^{-15}$ and $10^{-16}$, and the BCH error correction capability is chosen based upon this target UBER. However, due to the increased RBER of the NAND-based flash memory technology, the BCH error correction currently employed in the art for the recovery of data errors in a NAND-based flash memory is impractical to meet the target UBER.

Another type of error correction coding that may be employed in a flash storage controller is a low-density parity-check (LDPC) error correction coding. An LDPC code is a linear error correcting code having a parity check matrix with a small number of nonzero elements in each row and column. LDPC codes are capacity-approaching codes that allow the noise threshold to be set very close to the Shannon limit for a symmetric, memory-less channel. The noise threshold defines an upper bound for the channel noise, up to which the probability of lost information can be made as small as desired. LDPC error correction is superior to BCH error correction, with LDPC codes being capable of producing a UBER that is very near the Shannon limit with a lower code rate than is required using BCH error correction. However, LDPC codes may exhibit an error floor that limits the performance of the LDPC error correction. While it is known that the UBER steadily decreases as the signal-to-noise ratio condition of the channel improves, for LDPC codes there exists a point after which the rate of decrease in the UBER flattens. This region is commonly referred to as the error floor region for LDPC error correction. To guarantee a target UBER of between $10^{-15}$ and $10^{-16}$ with LDPC error correction, it is necessary to know the value of the error floor. The error floor for LDPC cannot be mathematically determined and simulation is necessary to identify the value of the error floor. However, with modern technology, it is not possible to simulate up to $10^{-16}$ to identify the value of the error floor, and as such, a target UBER of $10^{-16}$ cannot be guaranteed with LDPC error correction.

Accordingly, what is needed in the art is an improved flash controller that is capable of meeting the target UBER for a nonvolatile memory storage system in the presence of an error correction code error floor.

SUMMARY

In various embodiments, a nonvolatile memory system includes a nonvolatile memory storage module for storing encoded data and a nonvolatile memory controller. The encoded data stored in the nonvolatile memory storage module is encoded using an outer error correction code concatenated with an inner error correction code. The nonvolatile memory controller receives the encoded data stored in the nonvolatile memory storage module and attempts to decode and recover the data. The nonvolatile memory controller may recover the encoded data using the outer error correction code of the encoded data if it is determined that a correction capacity of the outer error correction code is not exceeded. Alternatively, the nonvolatile memory controller may recover the encoded data using the inner error correction code of the encoded data followed by the outer error correction code of the encoded data if it is determined that the correction capacity of the outer error correction code is exceeded. Additionally, if it is determined that the correction capacity of the outer error correction code is exceed after recovering the data using the inner error correction code and the outer error correction code, the nonvolatile memory storage module may perform a redundant array of independent disks (RAID) operation to recover the data.

More specifically, the nonvolatile memory controller may include an error detection and correction module for recovering the data received from the nonvolatile memory storage module. The error detection and correction module may include an outer error correction code decoder for recovering the data using the outer error correction code and an error detection module coupled to the outer error correction code decoder, wherein the error detection module may be used to determine if the correction capacity of the outer error correction code is exceeded during the recovery of the data. The error detection and correction module may further include an inner error correction code decoder coupled to the outer error correction code decoder. If the error detection module determines that the correction capacity of the outer error correction code is exceeded during the recovery of the data, the inner error correction code decoder may be operated to recover the data using the inner error correction code and the outer error correction code decoder may be subsequently used to recover the data using the outer error correction. The nonvolatile memory controller may further include a redundant array of independent disks (RAID) control module coupled to the error detection and correction module. The RAID control module may perform a RAID operation to recover the data if the error detection module determines that the correction capacity of the outer error correction codes is exceeded after recovering the data using the inner error correction code followed by the outer error correction code.

In a particular embodiment, the outer error correction code may be a Bose-Chaudhuri-Hocquenghem (BCH) code.

In an additional embodiment, the inner error correction code may be a low-density parity-check (LDPC) code and in a specific embodiment, the inner error correction code may be a quasi-cyclic low-density parity-check (LDPC) code.

The nonvolatile memory storage module may be a NAND flash memory module and the nonvolatile memory system may be a solid state drive (SSD).

The system in accordance with the present invention allows a target uncorrectable bit error rate (UBER) to be reached for a nonvolatile memory storage system in which the data exhibits a high raw bit error rate (RBER) and in the presence of an inner error correction code error floor.

A method for recovering data stored in a nonvolatile memory storage module includes, receiving encoded data from the nonvolatile memory storage module at a nonvolatile memory controller. The encoded data may include an outer error correction code concatenated with an inner error correction code. The method further includes recovering the data using the outer error correction code if a correction capacity of the outer error correction code is not exceeded. However, if the correction capacity of the outer error correction code is exceed, the method may include recovering the data using the inner error correction code followed by the outer error correction code. Additionally, if the correction capacity of the outer error correction code is exceeded after recovering the data using the inner error correction code followed by the outer error correction code, the data may be recovered by performing a redundant array of independent disks (RAID) operation.

In receiving the encoded data from the nonvolatile memory storage module, the nonvolatile memory controller may read the data and the outer error correction code encoding the data from a first flash page and may read the inner error correction code from a second flash page.

Recovering the data using the outer error correction code if a correction capacity of the outer error correction code is not exceeded may further include, decoding the encoded data using the outer error correction code, determining if decoding using the outer error correction code results in one or more decoding errors, determining if the one or more decoding errors exceeds the correction capacity of the outer error correction code and correcting the one or more decoding errors using the outer error correction code if the correction capacity of the outer error correction code is not exceeded.

Recovering the data using the inner error correction code followed by the outer error correction code if the correction capacity of the outer error correction code is exceeded may further include, decoding the encoded data using the inner error correction code and correcting one or more decoding errors in the data, decoding the data corrected by the inner error correction code using the outer error correction code, determining if decoding the corrected data using the outer error correction code results in one or more decoding errors, determining if the one or more decoding errors as a result of decoding the data corrected by the inner error correction code using the outer error correction code exceeds the correction capacity of the outer error correction code and correcting the one or more decoding errors using the outer error correction code if the correction capacity of the outer error correction code is not exceeded.

Recovering the data by performing a redundant array of independent disks (RAID) operation if the correction capacity of the outer error correction code is exceeded after recovering the data using the inner error correction code followed by the outer error correction code may further include, decoding the encoded data using the inner error correction code and correcting one or more decoding errors in the data, decoding the data corrected by the inner error correction code using the outer error correction code, determining if decoding the corrected data using the outer error correction code results in one or more decoding errors, determining if the one or more decoding errors as a result of decoding the data corrected by the inner error correction code using the outer error correction code exceeds the correction capacity of the outer error correction code and performing a redundant array of independent disks (RAID) operation to recover the data if the correction capacity of the outer error correction code is exceeded.

With the present invention, if data recovery fails using the outer error correction code because too many errors exist in the data (high RBER) to reliably recover the data using the outer error correction code and to meet a target UBER, the inner error correction code in combination with the outer correction code may be used to improve the reliability of the nonvolatile memory system. While the inner error correction code may exhibit an error floor, the inner error correction code may be used to correct the data, thereby reducing the number of errors in the data before using the outer error correction code to correct the data. The outer correction code may then be used to meet the target UBER in the presence of the error floor of the inner error correction code.

The method of the present invention allows a target uncorrectable bit error rate (UBER) to be reached for a nonvolatile memory storage system in which the data exhibits a high raw bit error rate (RBER) and in the presence of an inner error correction code error floor.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

In various embodiments, a nonvolatile memory system includes a nonvolatile memory storage module for storing encoded data and a nonvolatile memory controller. The encoded data stored in the nonvolatile memory storage module is encoded using an outer error correction code concatenated with an inner error correction code. The nonvolatile memory controller receives the encoded data stored in the nonvolatile memory storage module and attempts to decode and recover the data. The nonvolatile memory controller may recover the encoded data using the outer error correction code of the encoded data if it is determined that a correction capacity of the outer error correction code is not exceeded. Alternatively, the nonvolatile memory controller may recover the encoded data using the inner error correction code of the encoded data followed by the outer error correction code of the encoded data if it is determined that the correction capacity of the outer error correction code is exceeded. Additionally, if it is determined that the correction capacity of the outer error correction code is exceed after recovering the data using the inner error correction code and the outer error correction code, the nonvolatile memory storage module may perform a redundant array of independent disks (RAID) operation to recover the data.

Figure 1:
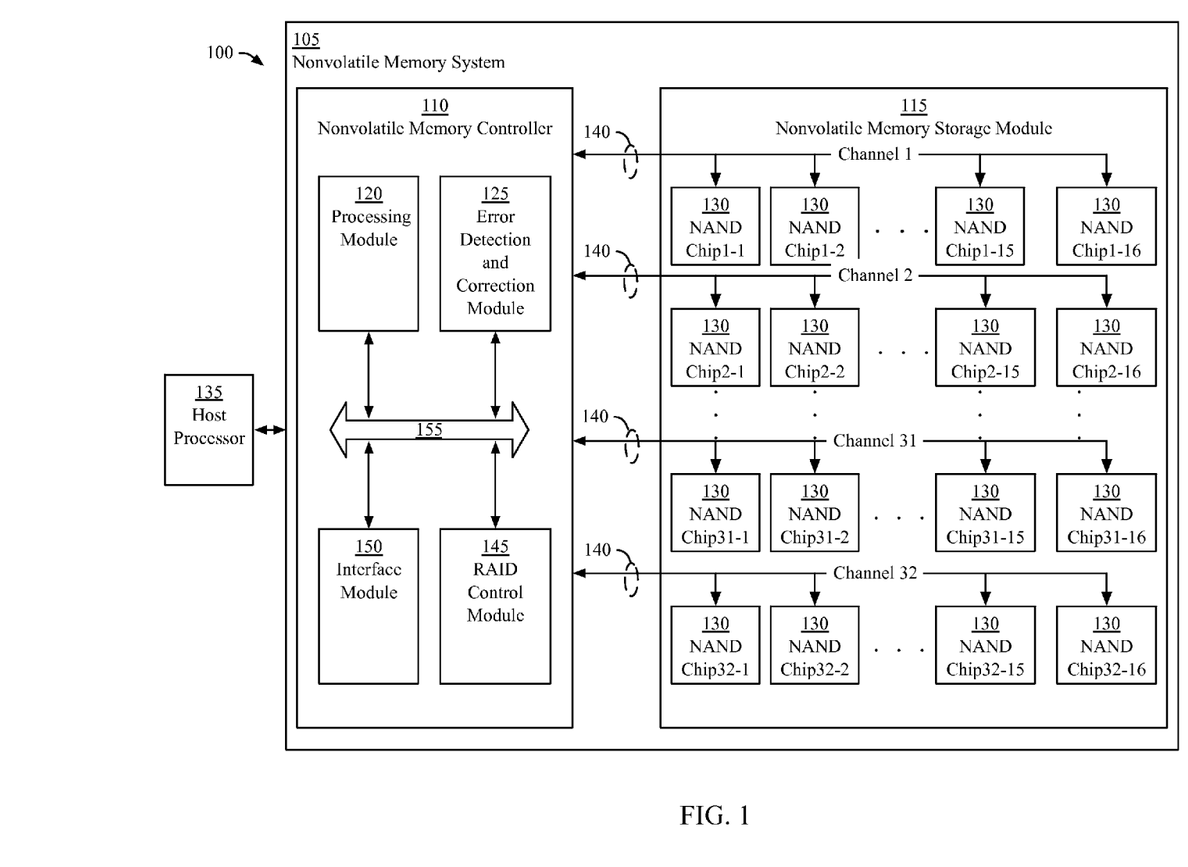
FIG. 1 is a block diagram of a computing system including a nonvolatile memory controller, in accordance with an embodiment of the present invention.

FIG. 1 illustrates a computing system 100, in accordance with an embodiment of the present invention. The computing system 100 includes a host processor 135 and a nonvolatile memory system 105 coupled to the host processor 135. The nonvolatile memory system 105 includes a nonvolatile memory controller 110 and a nonvolatile memory storage module 115 coupled to the nonvolatile memory controller 110. The nonvolatile memory system 105 may be a solid stated drive (SSD).

The nonvolatile memory controller 110 may include a processing module 120, an error correction and detection module 125, an interface module 150 and a redundant array of independent disks (RAID) control module 145. The processing module 120 may be coupled to the error correction and detection module 125, the interface module 150 and the RAID control module 145 through a communication bus 155, as is commonly know in the art. The error correction and detection module 125 may be coupled to the communication bus 155 and to the nonvolatile memory storage module through a plurality of corresponding data channels 140. The RAID control module 145 may be coupled to the nonvolatile memory storage module through the corresponding data channels 140 and to the communication bus 155.

The nonvolatile memory storage module 115 may include a plurality of nonvolatile memory storage chips 130 comprising a plurality of memory storage cells. The memory storage chips 130 may be organized in pages, each comprising a plurality of memory storage cells. In a particular embodiment, the nonvolatile memory storage module 115 may be based on NAND technology and may include 512 NAND memory storage chips 130 to provide a total storage capacity of 1 TBytes. A 32-data channel 140 configuration may be implemented to operate the 512 NAND memory storage chips 130 of the nonvolatile memory storage module 115 with the nonvolatile memory storage controller 110 using 16 independent channels.

In operation, the interface module 150 may receive one or more data write commands, and associated data, from the host processor 135. The interface module 150 may then communicate the data write commands to the error detection and correction module 125. The error detection and correction module 125 may encode the data prior to writing the data to the nonvolatile memory storage module. The data may be encoded using an outer error correction code concatenated with an inner error correction code.

After the data has been encoded and written to the nonvolatile memory storage module 115, the interface module 150 may receive one or more data read commands from the host processor 135. The interface module 150 may then communicate the data read commands to the processing module 120 to instruct the error detection and correction module 125 to read the encoded data from the nonvolatile memory storage module 115 over one of the communication channels 140. The error detection and correction module 125 may then attempt to recover the data from the encoded data using the outer error correction code of the encoded data. If the data recovery is successful, the data may be recovered and the error detection and correction module 125 may communicate the data recovery to the processing module 120. If the data recovery fails using the outer error correction code, the error correction and detection module 125 may attempt to recover the data from the encoded data by first using the inner error correction code and then using the outer error correction code. If the data recovery is successful using the inner error correction code followed by the outer error correction code, the data may be recovered and the error detection and correction module 125 may communicate the data recovery to the processing module 120. If the data recovery fails when using the inner error correction followed by the outer error correction code, the error correction and detection module 125 may communicate the failure to the processing module 120 and the processing module 120 may instruct the RAID control module 145 to access the nonvolatile memory storage module 115 to recover the data from the encoded data stored in the nonvolatile memory storage module 115.

In various embodiments, each of the processing module 120, the error detection and correction module 125, the interface module 150, the RAID control module 145 and the nonvolatile memory storage module 115 may include one or more hardware components, one or more software components, or some combination thereof. Examples of hardware components include a combinational logic circuit, a sequential logic circuit, a microprocessor, an embedded processor, an embedded controller, or the like. Examples of software components include a computing program, computing instructions, a software routine, or the like.

In various embodiments, the nonvolatile memory system 105 is implemented in an integrated circuit of an integrated circuit device, which may include an integrated circuit package containing the integrated circuit. In some embodiments, the nonvolatile memory system 105 is implemented in a single integrated circuit die. In other embodiments, the nonvolatile memory system 105 is implemented in more than one integrated circuit die of an integrated circuit device which may include a multichip package containing the integrated circuit die.

In various embodiments, the nonvolatile memory controller 110 is implemented in an integrated circuit of an integrated circuit device, which may include an integrated circuit package containing the integrated circuit. In some embodiments, the nonvolatile memory controller 110 is implemented in a single integrated circuit die. In other embodiments, the nonvolatile memory controller 110 is implemented in more than one integrated circuit die of an integrated circuit device which may include a multichip package containing the integrated circuit die.

In various embodiments, the nonvolatile memory storage module 115 is implemented in an integrated circuit of an integrated circuit device, which may include an integrated circuit package containing the integrated circuit. In some embodiments, nonvolatile memory storage module 115 is implemented in a single integrated circuit die. In other embodiments, nonvolatile memory storage module 115 is implemented in more than one integrated circuit die of an integrated circuit device which may include a multichip package containing the integrated circuit die.

Figure 2:
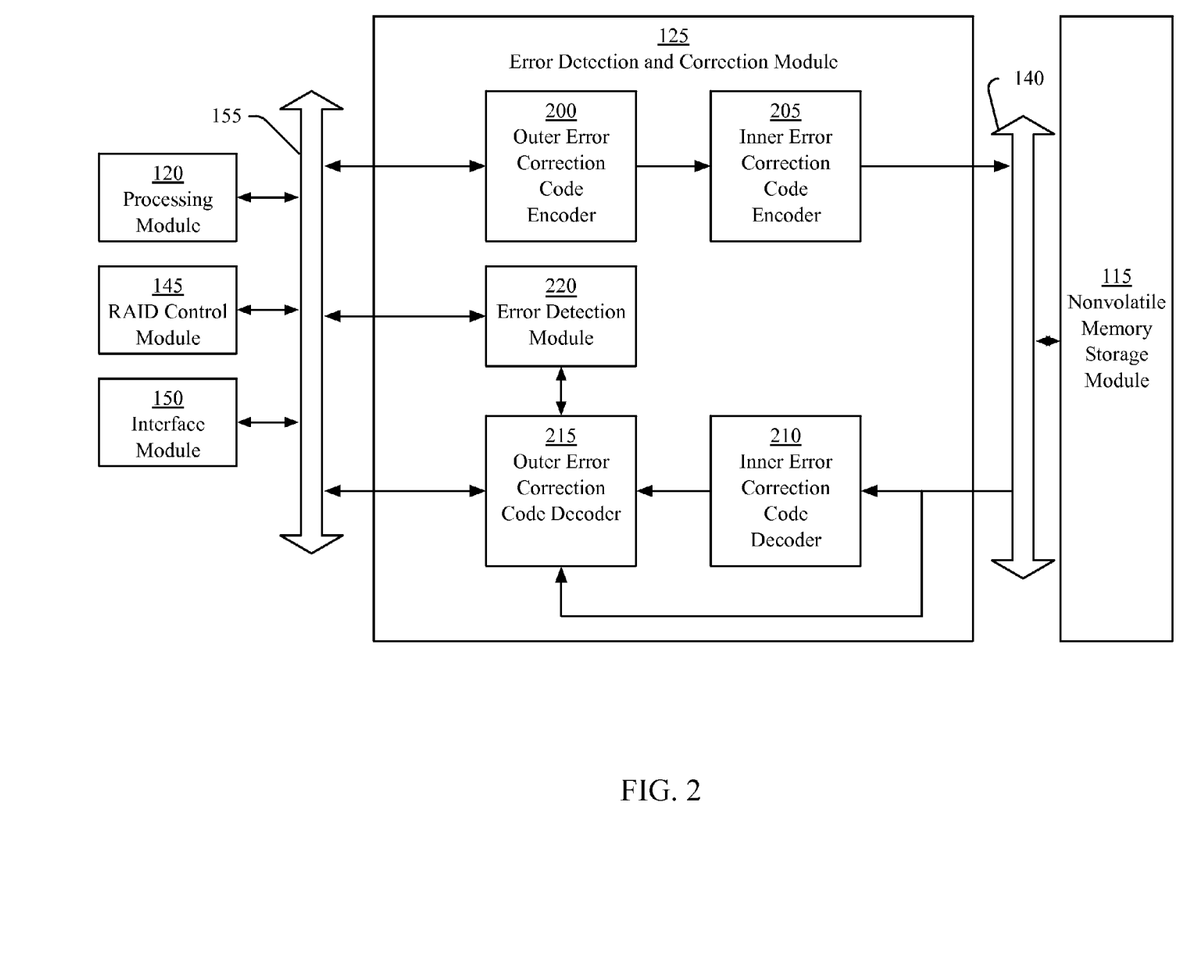
FIG. 2 is a block diagram of an error detection and correction module, in accordance with an embodiment of the present invention.

FIG. 2 illustrates the error correction and detection module 125, in accordance with an embodiment of the present invention. The processing module 120, the RAID control module 145 and the interface module 150 may be coupled together though a communication bus 155. The error detection and correction module 125 may be coupled to the processing module 120, the RAID control module 145 and the interface module 150 through the communication bus 155. The error detection and correction module 125 may be coupled to the nonvolatile memory storage module 115 through the communication bus 140.

The error detection and correction module 125 may include an outer error correction code encoder 200, an inner error correction code encoder 205, an outer error correction code decoder 215, an inner error correction code decoder 210 and an error detection module 220. The terms "inner" and "outer" may reference the physical location and/or logical location of the encoders and decoders within the error detection and correction module relative to the nonvolatile memory storage module. The outer error correction code encoder 200 may be coupled to the processing module 120, the interface module 150 through the communication bus 155. The inner error correction code encoder 205 may be coupled to the outer error correction code encoder 200 and to the nonvolatile memory storage module 115 through the communication bus 140. The inner error correction code decoder 210 may be coupled to the nonvolatile memory storage module 115 through the communication bus 140. The outer error correction code decoder 215 may be coupled to the nonvolatile memory storage module 115 through the communication bus 140, to the inner error correction code decoder 210 and to the error detection module 220. In a particular embodiment, the outer error correction code decoder 215 may comprise the error detection module 220. The outer error correction code decoder 215 may further be coupled to the processing module 120 and the interface module 150 through the communication channel 155. The error detection module 220 may be coupled to the outer error correction code decoder 215 and to the processing module 120, the RAID control module 145 and the interface module 150 through the communication channel 150.

In operation, the interface module 150 may receive one or more data write commands, and associated data, from the host processor 135. The interface module 150 may then communicate the data write commands to the error detection and correction module 125 and to the processing module 120 through the communication bus 155. The outer error correction code encoder 200 of the error detection and correction module 125 may encode the data with an outer error correction code. The outer error correction code encoder 200 may encode the data by adding redundant data, or parity bits, to the data, such that the data can be recovered from the nonvolatile memory storage module 115 when errors are subsequently introduced into the data by the nonvolatile memory storage module 115. Various mechanisms may lead to bit errors in flash memories, including noise at the power rails, voltage threshold disturbances during the reading and/or writing of neighboring cells, retention loss due to leakage within in the cells and tunneling. By encoding the data with an outer error correction concatenated with an inner error correction code, the error detection and correction module may subsequently read the encoded data from the nonvolatile memory storage module 115, and the redundant data bits added to the data may allow the error detection and correction module 125 to determine whether or not the data stored in the nonvolatile memory storage module 115 has been corrupted during the storage of the data, and if so, the error detection and correction module 125 may identify the specific data bits that have been corrupted and correct the data. As such, prior to writing the data to the nonvolatile memory storage module 115, the outer error correction code encoder 200 may add a number of parity bits to the data. After the outer error correction code encoder 200 has added the parity bits to the data using the outer error correction code, the inner error correction code encoder 205 may add additional parity bits to the data using an inner error correction code. The inner error correction code may be a different error correction code than the outer error correction code. The inner error correction code may exhibit an error floor. In accordance with an embodiment of the present invention, the data may be encoded using an outer error correction code concatenated with an inner error correction code, wherein the outer error correction code applied to the data by the outer error correction code encoder 200 is concatenated with the inner error correction code applied to the data by the inner error correction code encoder 205. The data comprising the outer error correction code concatenated with the inner error correction code may then be written to the nonvolatile memory storage module 115.

In an exemplary encoding of the data using the concatenated outer error correction and inner error correction code, the inner error correction code parity bits are not included in the outer error correction code parity. Separating the parity of the inner error correction code from the parity of the outer error correction code allows the inner error correction code to be stored in a different flash page than the outer error correction code and the data. The inner error correction code in a specific implementation may have a stronger error correction code than the outer error correction code. The stronger inner error correction code may result in a lower UBER at select RBERs. In addition, the stronger inner error correction code may result in an increased code rate for the inner error correction requiring a larger number of parity bits for encoding. Due to the increased number of parity bits in the stronger inner error correction code, the number of parity bits required for the inner error correction code rate may be such that the data and the inner error correction code are unable to fit on the same flash page and it may be necessary to store the inner error correction code in a different flash page than the data. In contrast, the outer error correction code may be a weaker error correction code requiring fewer parity bits for encoding. As such, the outer error correction code may be able to fit on the same flash page as the data.

After the data has been encoded and written to the nonvolatile memory storage module 115, the interface module 150 may receive one or more data read commands from the host processor 135. The interface module 150 may then communicate the data read commands to the processing module 120 to instruct the error detection and correction module 125 to read the encoded data from the nonvolatile memory storage module 125 over one of the communication channels 140. In reading the encoded data from the nonvolatile memory storage module 125, if the outer error correction code and the data encoded by the outer error correction code are stored on the same flash page, it may only be necessary for the error detection and correction module 125 to read the flash page that contains both the outer error correction code and the data. The encoded data read from the nonvolatile memory storage module 115 may be received by the outer error correction code decoder 215. The outer error correction code decoder 215 may then attempt to recover the data from the encoded data by decoding the data using the outer error correction code of the encoded data. The outer error correction code decoder 215 may then communicate with the error detection module 220 to determine if decoding the encoded data using the outer error correction code results in one or more decoding errors. In determining if one or more decoding errors are present in the decoded data, the error detection module 220 may use the redundant data bits that were added to the data by the outer error correction code encoder 200 to identify specific data bits that have been corrupted. The error detection module 220 may also be used to determine if the number of decoding errors resulting from the decoding of the encoded data using the outer error correction code exceeds the correction capacity of the outer error correction code. The correction code capacity of the outer error correction code decoder 215 will be exceeded if the number of errors is greater than the number of bits that the outer error correction code used by the outer error correction code decoder 215 is capable of correcting. If there are decoding errors in the data and the correction capacity of the outer error correction code is not exceeded, the outer error correction code decoder 215 may correct the error identified in the data. The corrected data may then be provided to the communication channel 155. If the error detection module 220 does not identify any errors in the decoded data, the decoded data may be provided to the communication channel 155 without being corrected by the outer error correction code decoder 215.

If the correction capacity of the outer error correction code decoder 215 is exceeded after decoding of the encoded data by the outer error correction code decoder 215, as identified by the error detection module 220, the error correction and detection module 125 may attempt to recover the data from the encoded data by first using the inner error correction code decoder 210 and then using the outer error correction code decoder 215. To recover the data using the inner error correction code 210 and the outer error correction code decoder 215, the processing module 120 may instruct the inner error correction code decoder 210 to read the encoded data from the nonvolatile memory storage module 115. In reading the encoded data from the nonvolatile memory storage module 125, if the outer error correction code and the data encoded by the outer error correction code are stored on the same flash page and the inner error correction code is stored on a different flash page, it may be necessary for the error detection and correction module 125 to read a first flash page that contains the outer error correction code and the data and to read a second flash page that contains the inner error correction code. The encoded data read from the nonvolatile memory storage module 115 may be received by the outer error correction code decoder 215. The inner error correction code decoder 210 may then decode the data using the inner error correction code. The inner error correction code decoder 210 may then determine if there are one or more errors in the decoded data and if it is determined that one or more errors exist in the decoded data, the inner error correction code decoder may correct the identified errors. In determining if one or more decoding errors are present in the decoded data, the inner error correction code decoder 210 may use the redundant data bits that were added to the data by the inner error correction code encoder 205 to identify specific data bits that have been corrupted. After any errors in the encoded data have been corrected by the inner error correction code decoder 210, the corrected data may be communicated to the outer error correction code decoder 215. The error detection module 220 may be used to determine if the corrected data from the inner error correction code decoder 210 is in fact free of errors. It is possible for the inner error correction code decoder 210 to determine that the data has been successfully decoded, when in fact errors may still be present in the data corrected by the inner error correction code decoder 210. In this case, the error detection module 220 may identify the errors that have not been successfully corrected by the inner error correction code decoder 210. In a particular embodiment, the outer error correction code decoder 215 may comprise the error detection module 220. The outer error correction code decoder 215 may then attempt to recover the data from the encoded data by decoding the data corrected by the inner error correction code decoder 210 using the outer error correction code of the encoded data. The outer error correction code decoder 215 may then communicate with the error detection module 220 to determine if decoding the data corrected by the inner error correction code decoder 210 using the outer error correction code results in one or more decoding errors. In determining if one or more decoding errors are present in the decoded data, the error detection module 220 may use the redundant data bits that were added to the data by the outer error correction code encoder 200 to identify specific data bits that have been corrupted. The error detection module 220 may also be used to determine if the number of decoding errors resulting from the decoding of the data corrected by the inner error correction code decoder 210 using the outer error correction code exceeds the correction capacity of the outer error correction code decoder 215. The correction code capacity of the outer error correction code decoder 215 will be exceeded if the number or error is greater than the number of bits that the outer error correction code used by the outer error correction code decoder 215 is capable of correcting. If there are decoding errors in the corrected data and the correction capacity of the outer error correction code is not exceeded, the outer error correction code decoder 215 may correct the errors identified in the data. The corrected data may then be provided to the communication channel 155. If the error detection module 220 does not identify any errors in the decoded data, the decoded data may be provided to the communication channel 155 without being further corrected by the outer error correction code decoder 215.

If the correction capacity of the outer error correction code decoder 215 is exceeded when the data corrected by the inner error correction code decoder 210 is decoded by the outer error correction code decoder 215, the error detection module 220 may communicate to the processing module that the error detection and correction module 125 is unable to recover the data. The error detection module 220 may communicate the failure to the processing module 120 and the processing module 120 may instruct the RAID control module 145 to access the nonvolatile memory storage module 115 to recover the data from the encoded data stored in the nonvolatile memory storage module 115.

In various embodiments, the inner error correction code module 210 and the outer error correction code module 215 are capable of correcting up to a maximum number of data bit errors in a data unit. In these embodiments, the error correction capacity of the inner error correction code module 210 and the outer error correction code module 215 is equal to the maximum number of data bit errors correctable in a data unit by the inner error correction code module 210 and the outer error correction code module 215. In other embodiments, the inner error correction code module 210 and the outer error correction code module 215 are programmable to select an error correction capacity of the inner error correction code module 210 and the outer error correction code module 215 for correcting up to the maximum number of data bit errors correctable in a data unit by the inner error correction code module 210 and the outer error correction code module 215. In these embodiments, the selected error correction capacity may be less than the maximum number of data bit errors correctable in a data unit by the inner error correction code module 210 and the outer error correction code module 215.

In various embodiments, each of the outer error correction code encoder 200, the inner error correction code encoder 205, the inner error correction decoder 210, the outer error correction code decoder 215 and the error detection module 220 may include one or more hardware components, one or more software components, or some combination thereof. Examples of hardware components include a combinational logic circuit, a sequential logic circuit, a microprocessor, an embedded processor, an embedded controller, or the like. Examples of software components include a computing program, computing instructions, a software routine, or the like.

In various embodiments, the inner error correction code may be a low-density parity check (LDPC) error correction code and the outer error correction code may be a Bose-Chaudhuri-Hochquenghem (BCH) error correction code.

The LDPC code may selected from one of a variety of error correction codes associated with LDPC codes, including regular or irregular LDPC codes, quasi-cyclic LDPC codes, irregular repeat accumulate (IRA) codes, codes based on projective geometry or any of a variety of error correction codes associated with LDPC as are known in the art. The LDPC correction code may be known to exhibit an error floor.

In various embodiments, the BCH error correction code may have a very high error correction capacity. For example, the BCH correction code may have an uncorrected bit error rate (UBER) of $1\times10^{-9}$ for a raw bit error rate (BER) of $1\times10^{-3}$. As another example, the BCH error correction code may have an uncorrected bit error rate (UBER) of $1\times10^{-12}$ for a raw bit error rate (BER) of $1\times10^{-3}$. In some embodiments, the BCH error correction code may have an uncorrected bit error rate (UBER) in the range of $1\times10^{-9}$ to $1\times10^{-15}$ for a raw bit error rate (BER) of $1\times10^{-3}$.

Figure 3:
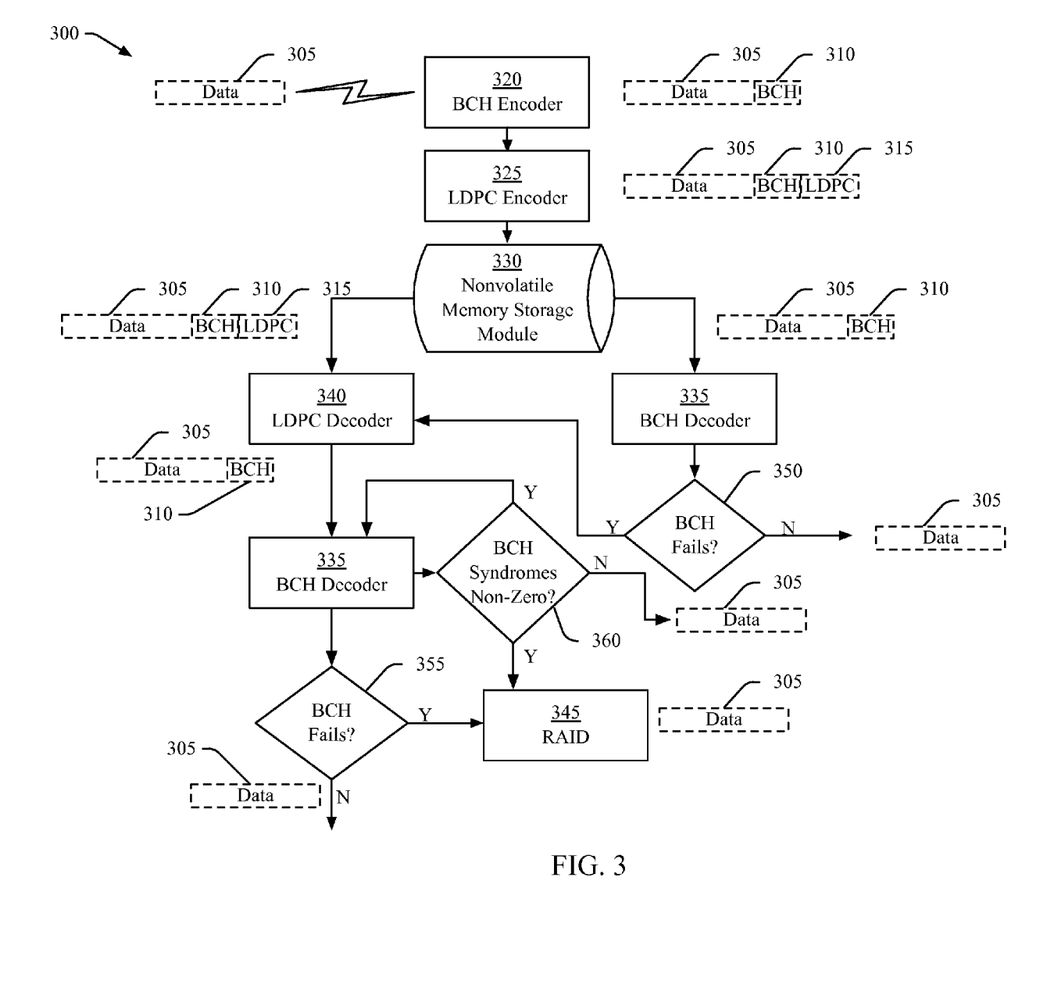
FIG. 3 is a diagram illustrating the flow of encoded data having an inner LDPC code concatenated with an outer BCH code, in accordance with an embodiment of the present invention

FIG. 3 is a diagram illustrating the flow of encoded data having an inner LDPC code concatenated with an outer BCH code, in accordance with an embodiment of the present invention. In the nonvolatile memory system 300 illustrated with reference to FIG. 3, upon the receipt of a write request, data 305 is received at a BCH encoder 320. The BCH encoder encodes the received data 305 by adding redundant bits 310 to the data 305. The number of bits added to the data is dependent upon the BCH code being used. As is known in the art, a "strong" BCH code would add more redundant bits to the data than a "weak" BCH code. The data 305 and BCH code 310 are then communicated to the LDPC encoder 325. The LDPC encoder 325 encodes the data 305 by adding redundant bits 315 to the data 305. In this way, the data is encoded using a concatenated code including a BCH code 310 and an LDPC code 325 by adding the BCH code 310 and the LDPC code 325 to the data 305 to form the encoded data. Depending upon the strength of the LDPC code 325, it may be necessary to store the data 305 and the BCH code 310 in a first flash page and to store the LDPC code 325 in a second flash page. Alternatively, the data 305, the BCH code 310 and the LDPC code 315 may be stored in the same flash page. The encoded data comprising the data 305 and the concatenated error codes 310, 315 are then communicated to the nonvolatile memory storage module 330. The encoded data is stored in the nonvolatile memory storage module 330 until the nonvolatile memory system 300 receives a read request.

Upon receiving a read request at the nonvolatile memory system 300, the nonvolatile memory system 300 reads the encoded data from the nonvolatile memory storage module 330 and communicates the encoded data, including the data 305 and the BCH code 310, to the BCH decoder 335. If the data 305 and the BCH code 310 are stored in the same flash page, it may only be necessary to read one flash page from the nonvolatile memory storage module 330. The BCH decoder 335 will attempt to recover the data 305 from the encoded data using the BCH code 310. The BCH decoder 335 recovers the data 305 from the encoded data by identifying any errors in the data using the BCH code 310 and correcting any identified errors. However, the BCH decoder 335 is only able to correct the number of errors up to the correction capacity of the BCH code 310. If the error correction capacity of the BCH decoder 335 is not exceeded, the BCH decoder 335 will be successful and the BCH decoder 335 will be able to recover the data 305 from the encoded data. If the error correction capacity of the BCH decoder 335 is exceeded and the BCH decoder 335 is unable to recover the data from the encoded data, the BCH decoder 335 recovery will fail 350.

If recovery of the data 305 using the BCH decoder 335 and the BCH code 310 fails, the nonvolatile memory system 300 communicates the encoded data, including the data 305, the BCH code 310 and the LDPC code 315, to the LDPC decoder 340. If the data 305 and the BCH code 310 are stored in the same flash page, but the LDPC code 315 is stored in a different flash page, it may be necessary to read a first flash page containing the data 305 and the BCH code 310 and to read a second flash page containing the LDPC code 315 from the nonvolatile memory storage module 330. Alternatively, the data 305, the BCH code 310 and the LDPC code 315 may be stored in the same flash page. The LDPC decoder 340 will recover the data 305 from the encoded data using the LDPC code 315. The LDPC decoder 340 recovers the data 305 from the encoded data by identifying any errors in the data using the LDPC code 315 and correcting any identified errors. After the data 305 has been decoded and corrected by the LDPC decoder 340, the data 305 and the BCH code 310 are communicated to the BCH decoder 335. The BCH decoder 335 will attempt to recover the data 305 from the encoded data corrected by the LDPC decoder 340 using the BCH code 310. The BCH decoder 335 recovers the data 305 from the corrected data by identifying any remaining errors in the data using the BCH code 310 and correcting any identified errors. However, the BCH decoder 335 is only able to correct the number of errors up to the correction capacity of the BCH code 310. If the error correction capacity of the BCH decoder 335 is not exceeded, the BCH decoder 335 will be successful and the BCH decoder 335 will be able to recover the data 305 from the data corrected by the LDPC decoder 340. If the error correction capacity of the BCH decoder 335 is exceeded and the BCH decoder 335 is unable to recover the data from data corrected by the LDPC decoder 340, the BCH decoder 335 recovery will fail 355.

If the nonvolatile memory system fails to recover the data 305 from the encoded data using the LDPC decoder 340 followed by the BCH decoder 335, the nonvolatile memory system will communicate the read request to a redundant array of independent disks (RAID) module to recover the data 305. A RAID algorithm may be performed by the RAID control module 345 on a standard RAID level (e.g., a RAID level 3-6), as is known in the relevant art.

Alternatively, after the data 305 has been decoded and corrected by the LDPC decoder 340, the data 305 and the BCH code 310 may be communicated to the BCH decoder 335. The BCH decoder 335 will attempt to recover the data 305 from the encoded data corrected by the LDPC decoder 340 using the BCH code 310. The BCH decoder 335 recovers the data 305 from the corrected data by identifying any remaining errors in the data using the BCH code 310 and correcting any identified errors. In identifying any remaining errors in the data, the BCH decoder 335 may calculate the syndromes of the data 305 decoded by the LDPC decoder 340. The BCH decoder 335 may then determine if the calculated syndromes are non-zero or all zeros 360. If it is determined that the syndromes are non-zero, then it can be established that the data 305 decoded by the LDPC decoder 340 has not been successfully recovered. In this case, the LDPC decoder 340 may determine that the data has been successfully recovered when in fact the data still contains errors. If it is determined that the BCH syndromes are non-zero 360, the data 305 may be sent to the BCH decoder 335 for further decoding. Alternatively, if it is determined that the BCH syndromes are non-zero 360, then the data 305 may be sent directly to the redundant array of independent disks (RAID) module to recover the data 305. A RAID algorithm may be performed by the RAID control module 345 on a standard RAID level (e.g., a RAID level 3-6), as is known in the relevant art.

Figure 4:
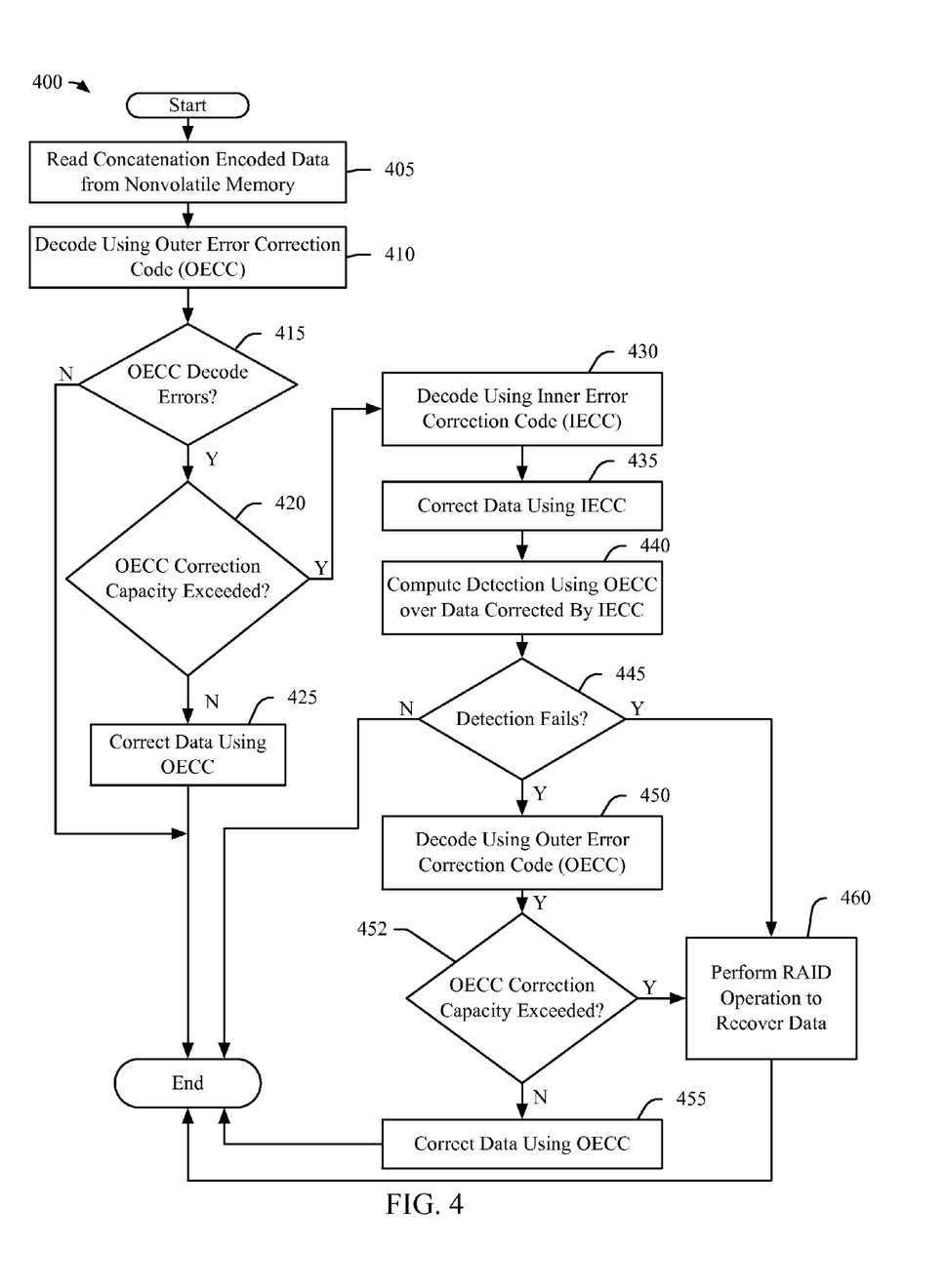
FIG. 4 is a flow diagram of a method of recovering encoded data, in accordance with an embodiment of the present invention.

FIG. 4 illustrates a flow diagram 400 for a method of recovering encoded data in a nonvolatile memory controller in accordance with an embodiment of the present invention. In accordance with various embodiments, upon receiving a read request for data stored in a nonvolatile memory storage module, the nonvolatile memory controller initiates a request to read the concatenation encoded data stored in the nonvolatile memory storage module 405. The concatenation encoded data stored in the nonvolatile memory storage module may include data having an outer error correction code concatenated with an inner error correction code. The outer error correction code and the inner error correction code may be stored in the same flash page as the data. Alternately, the outer error correction code and the data may be stored in a first flash page and the inner error correction code may be stored in a second flash page. The concatenation encoded data stored in the nonvolatile memory storage module may include an LDPC code as an inner error correction code and a BCH code as an outer error correction code.

After the concatenation encoded data is read from the nonvolatile memory storage module 405, the nonvolatile memory controller may recover the data from the concatenation encoded data by decoding the concatenation encoded data using the outer error correction code 410. To recover the data from the concatenation encoded data, the nonvolatile memory storage module may decode the data using the outer error correction code and then determine if there are any errors resulting from the decoding of the concatenation encoded data using the outer error correction code 415.

If there aren't any decoding errors resulting from decoding the concatenation encoded data using the outer error correction code 415, the data may be recovered without being corrected and the nonvolatile memory controller may transfer the recovered data to a host processor.

If there are decoding errors resulting from decoding the concatenation encoded data using the outer error correction code 415, the nonvolatile memory storage controller may then determine if the number of errors resulting from decoding the concatenation encoded data using the outer error correction code exceeds the correction capacity of the outer error correction code 420. In various embodiments, the correction capacity of the outer error correction code may be exceeded if the number of errors resulting from the decoding of the concatenation encoded data using the outer error correction code is greater than the number of errors correctable by the outer error correction code.

If the number of errors resulting from decoding the concatenation encoded data using the outer error correction code does not exceed the correction capacity of the outer error correction code, the data errors may be corrected using the outer error correction code 425 to successfully recover the data from the concatenated encoded data and the nonvolatile memory controller may transfer the recovered data to a host processor.

If the number of errors resulting from decoding the concatenation encoded data using the outer error correction code exceeds the correction capacity of the outer error correction code, then there are too many data errors for the outer error correction code to correct and the data may not be successfully recovered from the concatenation encoded data using only the outer error correction code. When the outer error correction code is unable to successfully recover the data from the concatenation encoded data using the outer error correction code, the nonvolatile memory controller may attempt to recover the data from the concatenated encoded data using the inner error correction code and the outer error correction code.

To recover the data from the concatenation encoded data using the inner error correction code and the outer error correction, the concatenation encoded data may first be decoded using the inner error correction code 430. Any errors detected during the decoding of the concatenation encoded data using the inner error correction code may be corrected using the inner error correction code 435. After the concatenation encoded data has been decoded and corrected using the inner error correction code, the detection over the data that has been corrected using the inner error correction code may be computed 440 using the outer error correction code decoder.

If the computed detection over the data corrected using the inner error correction code 440 indicates that the detection has failed 445 then it may be concluded that the data decoded by the inner error correction code decoder has not been successfully recovered and that the inner error correction code decoder has incorrectly determined that the data has been successfully recovered when in fact the data still contains errors. If the detection fails 445, the data may be decoded using the outer error correction code decoder 450 if the correction capacity of the outer error correction code capacity has not been exceeded 452. Alternatively, if the detection fails 445, a redundant array of independent disks (RAID) operation 460 may be performed to recover the data.

If the number of errors resulting from decoding the data corrected by the inner error correction code using the outer error correction code does not exceed the correction capacity of the outer error correction code, the data errors may be corrected using the outer error correction code 455 to successfully recover the data from the concatenated encoded data and the nonvolatile memory controller may transfer the recovered data to a host processor.

If the number of errors resulting from decoding the data corrected by the inner error correction code using the outer error correction code exceeds the correction capacity of the outer error correction code, then there are too many data errors for the outer error correction code to correct and the data may not be successfully recovered from the concatenation encoded data using only the inner error correction code in combination with the outer error correction code.

If the number of errors resulting from decoding the data corrected by the inner error correction code using the outer error correction code exceeds the correction capacity of the outer error correction code, the nonvolatile memory controller may communicate the read request to a redundant array of independent disks (RAID) control module to perform a RAID operation 460 for the read request to recover the data from the nonvolatile memory storage module.

Alternatively, after the concatenation encoded data has been decoded and corrected using the inner error correction code, the syndromes of the corrected data may be calculated using the outer error correction code 440. If the syndromes of the corrected data are non-zero, then the nonvolatile memory controller may communicate the read request to a redundant array of independent disks (RAID) control module to perform a RAID operation 460 for the read request to recover the data from the nonvolatile memory storage module.

With the present invention, if data recovery fails using the outer error correction code because too many errors exist in the data (high RBER) to reliably recover the data using the outer error correction code and to meet a target UBER, the inner error correction code in combination with the outer correction code may be used to improve the reliability of the nonvolatile memory system. While the inner error correction code may exhibit an error floor, the inner error correction code may be used to correct the data, thereby reducing the number of errors in the data before using the outer error correction code to correct the data. The outer correction code may then be used to meet the target UBER in the presence of the error floor of the inner error correction code.

The method of the present invention allows a target uncorrectable bit error rate (UBER) to be reached for a nonvolatile memory storage system in which the data exhibits a high raw bit error rate (RBER) in the range of an error floor in the correction code.

In the present invention, the LDPC decoder is removed from the main data path to improve the overall performance of the nonvolatile memory system. By removing the LDPC decoder from the main data path, it is no longer necessary for the nonvolatile memory system to provide mutually exclusive parallel access to the LDPC decoder for every channel, or to experience a performance penalty when sharing the LDPC decoder, in order to determine if the data is inerrant. As such, removing the LDPC decoder from the main data path eliminates the need for multiple LDPC decoders in the system without sacrificing the performance of the system.

During the life of the nonvolatile memory storage system, the error rate of the nonvolatile storage system typically increases. With the present invention, the LDPC decoder is only used when the error rates are so high that they exceed the correctability of the BCH code, which typically begins to occur toward the end of life of the device. As such, in the present invention, for the majority of the device life the LDPC decoder may be removed from the main data path, resulting in the ability to design a smaller, lower bandwidth, and lower power LDPC decoder.

LDPC is able to correct data with a very high number of errors using fewer parity bits than other codes known in the art and can perform corrections with error rates that exceed the capability of most other codes. However, the code rates required to implement LDPC may require that the LDPC code be stored in a separate flash page from the data it is encoding. In the present invention, the BCH code rate may be small enough to be able to store the BCH parity in the same flash page as the data. While the smaller code rate for the BCH code may result in a less robust code than desired, the LDPC encoder can be implemented to overcome the weakness in the BCH code. However, by keeping the BCH code rate small and thereby keeping the BCH parity on the same flash page as the data, the system performance is improved because only one flash page needs to be read to decode the data. Additionally, the software/firmware of the nonvolatile memory system can be simplified by eliminating the need to coordinate the complex interactions of the system when the BCH parity is stored on a different flash page than the data.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A method for recovering data from encoded data stored in a nonvolatile memory storage module, the method comprising:
   receiving encoded data from a nonvolatile memory storage module at a nonvolatile memory controller, the encoded data comprising data encoded with an outer error correction code concatenated with an inner error correction code; and
   recovering the data from the encoded data by identifying any errors in the encoded data using the outer error correction code and correcting any identified errors in the encoded data using the outer error correction code if an error correction capacity of the outer error correction code is not exceeded; or
   recovering the data from the encoded data by identifying any errors in the encoded data using the inner error correction code and correcting any identified errors in the encoded data using the inner error correction code followed by identifying any remaining errors that were not successfully corrected by the inner error correction code using the outer error correction code and correcting any remaining errors that were not successfully corrected by the inner error correction code using the outer error correction code if the error correction capacity of the outer error correction code is exceeded before correcting the errors in the encoded data using the inner error correction code but is not exceeded after correcting the errors in the encoded data using the inner error correction code; or
   recovering the data from the encoded data by performing a redundant array of independent disks (RAID) operation if the error correction capacity of the outer error correction code is exceeded after recovering the data using the inner error correction code.

2. The method of claim 1, wherein the outer error correction code is a Bose-Chaudhuri-Hocquenghem (BCH) code.

3. The method of claim 1, wherein the inner error correction code is a low-density parity-check (LDPC) code.

4. The method of claim 1, wherein receiving encoded data from a nonvolatile memory storage module at a nonvolatile memory controller further comprises, reading a flash page comprising the encoded data and the outer error correction code for encoding the data from the nonvolatile memory storage module.

5. The method of claim 1, wherein receiving encoded data from a nonvolatile memory storage module at a nonvolatile memory controller further comprises, reading a first flash page comprising the encoded data and the outer error correction code for encoding the data and reading a second flash page comprising the inner error correction code for encoding the data from the nonvolatile memory storage module.

6. The method of claim 1, further comprising:
calculating at least one syndrome of the outer error correction code after recovering the data from the encoded data by identifying any errors in the encoded data using the inner error correction code and correcting any identified errors in the encoded data using the inner error correction code; and
recovering the data from the encoded data by correcting the errors in the encoded data using the inner error correction code followed by performing a redundant array of independent disks (RAID) operation if the at least one syndrome of the outer error correction code is non-zero after recovering the data from the encoded data by correcting any identified errors in the encoded data using the inner error correction code.

7. The method of claim 1, wherein the inner error correction code is a quasi-cyclic low-density parity-check (LDPC) code.

8. The method of claim 1, wherein the nonvolatile memory storage module is a NAND flash memory module.

9. The method of claim 1, wherein recovering the data from the encoded data by identifying any errors in the encoded data using the outer error correction code and correcting any identified errors in the encoded data using the outer error correction code if an error correction capacity of the outer error correction code is not exceeded further comprises:
decoding the encoded data using the outer error correction code;
determining if decoding the encoded data using the outer error correction code results in one or more decoding errors;
determining if the one or more decoding errors exceeds the error correction capacity of the outer error correction code; and
correcting the one or more decoding errors using the outer error correction code if the error correction capacity of the outer error correction code is not exceeded.

10. The method of claim 1, wherein recovering the data from the encoded data by identifying any errors in the encoded data using the inner error correction code and correcting any identified errors in the encoded data using the inner error correction code followed by identifying any remaining errors that were not successfully corrected by the inner error correction code and correcting any remaining errors in the encoded data that were not successfully corrected by the inner error correction code using the outer error correction code if the error correction capacity of the outer error correction code is exceeded before correcting the errors in the encoded data using the inner error correction code but is not exceeded after correcting the errors in the encoded data using the inner error correction code further comprises:
decoding the encoded data using the inner error correction code;
determining if decoding the encoded data using the inner error correction code results in one or more decoding errors, and if decoding the encoded data using the inner error correction code results in one or more decoding errors, correcting the one or more decoding errors using the inner error correction code;
decoding the encoded data corrected by the inner error correction code using the outer error correction code;
determining if decoding the encoded data corrected by the inner error correction code using the outer error correction code results in one or more decoding errors that were not successfully corrected using the inner error correction code;
determining if the one or more decoding errors that were not successfully corrected by the inner error correction code using the outer error correction code exceeds the error correction capacity of the outer error correction code; and
correcting the one or more decoding errors that were not successfully corrected by the inner error correction code using the outer error correction code if the error correction capacity of the outer error correction code is not exceeded.

11. The method of claim 1, wherein recovering the data from the encoded data by performing a redundant array of independent disks (RAID) operation if the error correction capacity of the outer error correction code is exceeded after using the inner error correction code further comprises:
decoding the encoded data using the inner error correction code;
determining if decoding the encoded data using the inner error correction code results in one or more decoding errors, and if decoding the encoded data using the inner error correction code results in one or more decoding errors, correcting the one or more decoding errors using the inner error correction code;
decoding the encoded data corrected by the inner error correction code using the outer error correction code;
determining if decoding the encoded data corrected by the inner error correction code using the outer error correction code results in one or more decoding errors that were not successfully corrected using the inner error correction code;
determining if the one or more decoding errors that were not successfully corrected by the inner error correction code using the outer error correction code exceeds the error correction capacity of the outer error correction code;
performing a redundant array of independent disks (RAID) operation to recover the data if the error correction capacity of the outer error correction code is exceeded.

12. A nonvolatile memory system comprising:
a nonvolatile memory storage module storing encoded data, the encoded data comprising data encoded with an outer error correction code concatenated with an inner error correction code; and
a nonvolatile memory controller coupled to the nonvolatile memory storage module, the nonvolatile memory controller to recover data from the encoded data stored in the nonvolatile memory storage module by recovering the data from the encoded data by identifying any errors in the encoded data using the outer error correction code and correcting any identified errors in the encoded data nonvolatile memory storage module using the outer error correction code if an error correction capacity of the outer error correction code is not exceeded, or recovering the data from the encoded data by identifying any errors in the encoded data using the inner error correction code and correcting any identified errors in the encoded data using the inner error correction code followed by identifying any remaining errors that were not successfully corrected by the inner error correction code using the outer error correction code and correcting any remaining errors in the encoded data that were not successfully corrected by the inner error correction code using the outer error correction code if the error correction capacity of the outer error correction code is exceeded before correcting the errors in the encoded data using the inner error correction code but is not exceeded after correcting the errors in the encoded data using the inner error correction code, or recovering the data from the encoded data by performing a redundant array of independent disks (RAID) operation if the error correction capacity of the outer error correction code is exceeded after recovering the data using the inner error correction code.

13. The nonvolatile memory storage system of claim 12, wherein the encoded data and the outer error correction code are stored in a first flash page of the nonvolatile memory storage module and the inner error correction code is stored in a second flash page of the nonvolatile memory storage module.

14. The system of claim 12, wherein the outer error correction code is a Bose-Chaudhuri-Hocquenghem (BCH) code.

15. The system of claim 12, wherein the inner error correction code is a low-density parity-check (LDPC) code.

16. The system of claim 12, wherein the inner error correction code is a quasi-cyclic low-density parity-check (LDPC) code.

17. The system of claim 12, wherein the nonvolatile memory storage module is a NAND flash memory module.

18. The system of claim 12, wherein the nonvolatile memory system is a solid state drive (SSD).

19. The system of claim 12, wherein the nonvolatile memory controller further comprises, an error detection and correction module for recovering the data from the encoded data, the error detection and correction module comprising:
an outer error correction code decoder for recovering the data from the encoded data by decoding the encoded data using the outer error correction code; and
an error detection module coupled to the outer error correction code decoder, the error detection module to determine if the error correction capacity of the outer error correction code is exceeded.

20. The system of claim 19, wherein the error detection and correction module further comprises an inner error correction code decoder coupled to the outer error correction code decoder, the inner error correction code decoder for recovering the data from the encoded data by correcting the errors in the encoded data using the inner error correction before recovering the data using the outer error correction code decoder by correcting any errors in the encoded data that were not successfully corrected by the inner error correction code, if the error detection module determines that the error correction capacity of the outer error correction code is exceeded.

21. The system of claim 20, wherein the nonvolatile memory controller further comprises, a redundant array of independent disks (RAID) control module coupled to the error detection and correction module, the RAID control module to perform the RAID operation to recover the data from the encoded data if the error detection module determines that the error correction capacity of the outer error correction code is exceeded after recovering the data using the inner error correction code.

22. The system of claim 20, wherein the nonvolatile memory controller further comprises, a redundant array of independent disks (RAID) control module coupled to the error detection and correction module, the RAID control module to perform the RAID operation to recover the data from the encoded data if the error detection module determines that at least one syndrome of the data recovered by the inner error correction code is non-zero after recovering the data from the encoded data by correcting the errors in the encoded data using the inner error correction code.

23. A nonvolatile memory controller comprising:
an error detection and correction module to receive encoded data stored in a nonvolatile memory storage module, the encoded data comprising data encoded with an outer error correction code concatenated with an inner error correction code, the error correction module to recover the data from the encoded data stored in the nonvolatile memory storage module by recovering the data from the encoded data by identifying any errors in the encoded data using the outer error correction code and correcting any identified errors in the encoded data using the outer error correction code if an error correction capacity of the outer error correction code is not exceeded, or recovering the data from the encoded data by identifying any errors in the encoded data using the inner error correction code and correcting any identified errors in the encoded data using the inner error correction code followed by identifying any remaining errors that were not successfully corrected by the inner error correction code using the outer error correction code and correcting any remaining errors in the encoded data that were not successfully corrected by the inner error correction code using the outer error correction code if the error correction capacity of the outer error correction code is exceeded before correcting the errors in the encoded data using the inner error correction code but is not exceeded after correcting the errors in the encoded data using the inner error correction code; and
a redundant array of independent disks (RAID) control module coupled to the error correction module, the RAID control module to perform a RAID operation to recover the data from the encoded data if the error correction capacity of the outer error correction code is exceeded after recovering the data using the inner error correction code or to perform the RAID operation to recover the data from the encoded data if the error detection module determines that at least one syndrome of the data recovered by the inner error correction code is non-zero after recovering the data from the encoded data using the inner error correction code.

24. The nonvolatile memory controller of claim 23, wherein the outer error correction code is a Bose-Chaudhuri-Hocquenghem (BCH) code.

25. The nonvolatile memory controller of claim 23, wherein the inner error correction code is a low-density parity-check (LDPC) code.

* * * * *

UNITED STATES PATENT AND TRADEMARK OFFICE
CERTIFICATE OF CORRECTION

| | | |
|---|---|---|
| PATENT NO. | : 8,656,257 B1 | Page 1 of 1 |
| APPLICATION NO. | : 13/434770 | |
| DATED | : February 18, 2014 | |
| INVENTOR(S) | : Rino Micheloni et al. | |

It is certified that error appears in the above-identified patent and that said Letters Patent is hereby corrected as shown below:

In the Claims:

Column 18, line 66 delete "nonvolatile memory storage module".

Signed and Sealed this
Twenty-seventh Day of May, 2014

Michelle K. Lee
*Deputy Director of the United States Patent and Trademark Office*